US011665976B2

(12) United States Patent
Sasaki et al.

(10) Patent No.: US 11,665,976 B2
(45) Date of Patent: May 30, 2023

(54) RESERVOIR ELEMENT AND NEUROMORPHIC ELEMENT

(71) Applicant: TDK CORPORATION, Tokyo (JP)

(72) Inventors: Tomoyuki Sasaki, Tokyo (JP); Tatsuo Shibata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 825 days.

(21) Appl. No.: 16/565,884

(22) Filed: Sep. 10, 2019

(65) Prior Publication Data

US 2020/0083433 A1 Mar. 12, 2020

(30) Foreign Application Priority Data

Sep. 12, 2018 (WO) ................ PCT/JP2018/033800

(51) Int. Cl.
*H01L 43/02* (2006.01)
*G06N 3/08* (2023.01)
*G06N 3/063* (2023.01)
*H01L 43/10* (2006.01)

(52) U.S. Cl.
CPC ............ *H01L 43/02* (2013.01); *G06N 3/063* (2013.01); *G06N 3/08* (2013.01); *H01L 43/10* (2013.01)

(58) Field of Classification Search
CPC .......... G06N 3/063; G06N 3/08; G06N 3/06; G06N 3/04; H01L 43/02; H01L 43/10
See application file for complete search history.

(56) References Cited

U.S. PATENT DOCUMENTS

| 7,411,235 | B2 * | 8/2008 | Saito ................. H01L 29/66984 977/932 |
| 2004/0091748 | A1 * | 5/2004 | Kamata ................... G11B 5/743 428/848.3 |
| 2012/0251847 | A1 * | 10/2012 | Takenaga .............. G11C 11/161 428/836 |
| 2017/0116515 | A1 * | 4/2017 | Abel .................... G06N 3/0445 |

FOREIGN PATENT DOCUMENTS

WO    2018/212201 A1    11/2018

OTHER PUBLICATIONS

M. Sharad, C. Augustine, G. Panagopoulos and K. Roy, "Spin-Based Neuron Model With Domain-Wall Magnets as Synapse," in IEEE Transactions on Nanotechnology, vol. 11, No. 4, pp. 843-853, Jul. 2012 (Year: 2012).*

Nakano et al., "Physical Reservoir Computing for Hardware Implementation," 2018 Papers from the IEEJ National Convention [DVD-ROM], Japan, The Institute of Electrical Engineers of Japan, Mar. 5, 2018, pp. 13-16 [S16-4].

(Continued)

*Primary Examiner* — Kamran Afshar
*Assistant Examiner* — Brian J Hales
(74) *Attorney, Agent, or Firm* — Oliff PLC

(57) ABSTRACT

A reservoir element of the first aspect of the present disclosure includes: a spin conduction layer containing a non-magnetic conductor; ferromagnetic layers positioned in a first direction with respect to the spin conduction layer and spaced apart from each other in a plan view from the first direction; and via wirings electrically connected to spin conduction layer on a surface opposite to a surface with the ferromagnetic layers.

17 Claims, 13 Drawing Sheets

(56) References Cited

OTHER PUBLICATIONS

Nomura, Hikaru et al., "Reservoir Computing With Nanomagnet Array," Preprints of The 65th JSAP Spring Meeting 2018, Japan, The Japan Society of Applied Physics, Mar. 5, 2018, p. 136 (18p-D104-4), ISBN 978-4-86348-661-4.

Translation of Dec. 22, 2020 Office Action issued in Japanese Patent Application No. 2019-212322.

Sharad, M. et al., "Spin-Based Neuron Model With Domain-Wall Magnets as Synapse", IEEE Transactions On Nanotechnology, IEEE Service Center, Piscataway, NJ, US, vol. 11, No. 4, Jul. 1, 2012, pp. 843-853, XP011454852, ISSN: 1536-125X, DOI: 10.1109/TNANO.2012.2202125.

Mar. 19, 2020 Extended Search Report issued in European Patent Application No. 19196449.3.

Torrejon, Jacob et al., "Neuromorphic Computing With Nanoscale Spintronic Oscillators", Nature, vol. 547, pp. 428-431, (2017).

Takahashi, S et al., "Spin Injection and Detection in Magnetic Nanostructures", Phys. Rev. B, vol. 67, Jrnl. (5),pp. 052409-1-052409-4, (2003).

Sasaki, Tomoyuki et al., "Electrical Spin Injection Into Silicon Using MGO Tunnel Barrier", Applied Physics Express, vol. 2, pp. 053003-1-053003-3, (2009).

Sasaki, Tomoyuki et al., "Spin Transport in Nondegenerate Si With a Spin Mosfet Structure at Room Temperature", Physical Review Applied, vol. 2, pp. 034005, (2014).

Slonczewski, J.C., "Current-Driven Excitation of Magnetic Multilayers", Journal of Magnetism and Magnetic Materials, vol. 159, pp. L1-L7, (1996).

Feb. 3, 2023 Office Action issued in Chinese Patent Application No. 201910858790.X.

* cited by examiner

RESERVOIR ELEMENT AND NEUROMORPHIC ELEMENT

BACKGROUND OF THE INVENTION

Field of the Invention

The present disclosure relates to a reservoir element and a neuromorphic element.

Description of Related Art

The neuromorphic element is an element that mimics a human brain by means of a neural network. Neuromorphic elements artificially mimic the relationship between neurons and synapses in the human brain.

The Hierarchical element is one of the neuromorphic elements. The hierarchical element has hierarchically arranged chips (neurons in the brain) and means of communication (synapses in the brain) that connects them. The hierarchical element increases the correct answer rate of problems by means of transmission (synapses) performing a learning process (learning). Learning means finding information that can be used in the future. The neuromorphic element weights input data. Learning is performed in each level in the hierarchical element.

Learning at each level, however, increases in the number of chips (neurons) impose a significant burden on circuit design and contribute to increased power consumption of the neuromorphic elements. Reservoir computers are being studied as one way to reduce this burden.

The reservoir computer is one of the neuromorphic elements. The reservoir computer includes a reservoir element and an output part. The reservoir element includes chips that interact with each other. The chips interact with each other by the input signal and output the signal. Weights are fixed in transmission means connecting multiple chips and the transmission means is not able to learn. The output part learns from the signal from the reservoir element and outputs the outcome to the outside. The reservoir computer compresses the data with a reservoir element and weights the data at the output part to increase the correct answer rate of the problem. Learning on the reservoir computer is done only at the output part. Reservoir computers are expected to be one means of enabling simplified circuit design and increased power consumption efficiency of neuromorphic elements.

Non-Patent Document 1 describes a neuromorphic element using a spin torque oscillator (STO) element as a chip (neuron).

CITATION LIST

Non Patent Documents

[Non Patent Document 1] Jacob Torrejon et al., Nature, Vol. 547, pp. 428-432 (2017)
[Non-patent Document 2] S. Takahashi and S. Maekawa, Phys. Rev. B67(5), 052409 (2003).

SUMMARY

However, the neuromorphic element using the STO element on the chip needs to align the resonance frequencies of each STO element. The resonance frequencies of the STO elements may vary depending on manufacturing errors, etc., and the STO elements may not interact sufficiently because of the above-described discrepancy. The STO element also oscillates by applying a high frequency current in a lamination direction. The long-term application of high frequency current in the lamination direction of the STO element having an insulating layer can cause failure of the STO element.

The present disclosure has been made in view of the above-described circumstances and provides a stable operating reservoir element and a neuromorphic element.

Means for Solving Problems

The present disclosure provides the following means for solving the above-described problems.

(1) The first aspect of the present disclosure is a reservoir element including: a spin conduction layer containing a non-magnetic conductor; a plurality of ferromagnetic layers positioned in a first direction with respect to the spin conduction layer and spaced apart from each other in a plan view from the first direction; and a plurality of via wirings electrically connected to the ferromagnetic layers of the spin conduction layer.

(2) In the reservoir element related to the above-described aspect, each of the ferromagnetic layers may be located in a position overlapping with each of the via wirings, respectively, in the plan view from the first direction.

(3) The reservoir element related to the above-described aspect may further include a reference potential terminal electrically connected to the spin conduction layer.

(4) In the reservoir element related to the above-described aspect, the each of the via wirings may contain a ferromagnetic material, and an orientation direction of magnetization of the ferromagnetic material constituting each of the via wirings may be opposite to an orientation direction of magnetization of the ferromagnetic layers.

(5) The reservoir element related to the above-described aspect may further include a first tunnel barrier layer between the spin conduction layer and the ferromagnetic layers.

(6) The reservoir element related to the above-described aspect may further include a second tunnel barrier layer between the spin conduction layer and the via wirings.

(7) In the reservoir element related to the above-described aspect, a distance between two adjacent ferromagnetic layers among the ferromagnetic layers may be equal to or less than a spin transport length of a material constituting the spin conduction layer.

(8) In the reservoir element related to the above-described aspect, a distance between two adjacent ferromagnetic layers among the ferromagnetic layers may be equal to or less than a spin diffusion length of a material constituting the spin conduction layer.

(9) In the reservoir element related to the above-described aspect, the spin conduction layer may include a metal or an alloy of an element selected from a group consisting of Cu, Ag, Al, Mg, and Zn.

(10) In the reservoir element related to the above-described aspect, the spin conduction layer may include a simple element or a compound of an element selected from the group consisting of Si, Ge, and C.

(11) In the reservoir element related to the above-described aspect, the ferromagnetic layers may be arranged in a hexagonal lattice form in the plan view from the first direction.

(12) In the reservoir element related to the above-described aspect, the ferromagnetic layers may form a plurality of bundles, the ferromagnetic layers being close-packed in each of the bundles in the plan view from the first direction, and the ferromagnetic layers in each of the bundles may be arranged in a hexagonal lattice form.

(13) The second aspect of the present disclosure is a neuromorphic element including: the reservoir element according to the above-described aspect; an input part connected to the reservoir element; and an output part connected to the reservoir element, the output part being configured to perform learning process on a signal from the reservoir element.

The reservoir and the neuromorphic element related to embodiment of the present disclosure are capable of stable operation.

EMBODIMENTS

Hereinafter, the present embodiments will be described in detail with reference to the drawings. The drawings used in the following description may enlarge the characterizing portions for convenience in order to make the features understandable, and the dimensional ratios of each component may differ from the actual ones. The materials, dimensions, etc. illustrated in the following description are exemplary, and the present disclosure is not limited thereto, and may be implemented with appropriate modifications to the extent that the effects of the present disclosure are achieved.

First Embodiment

Figure 1:
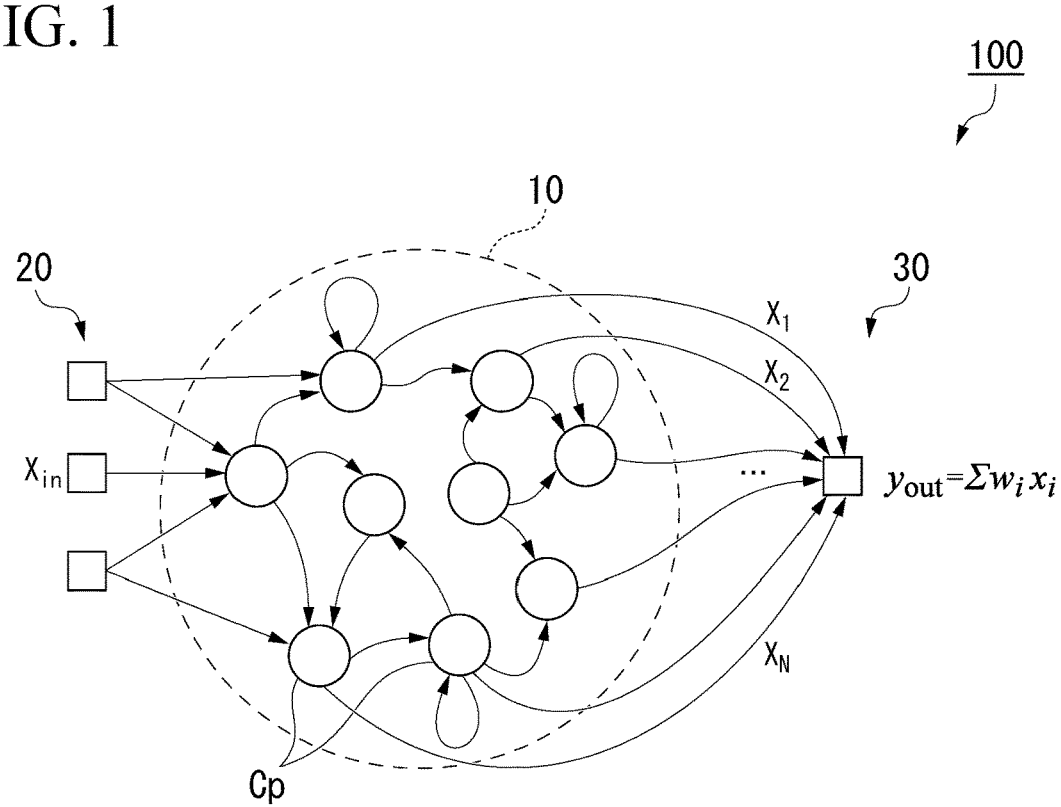
FIG. 1 is a conceptual diagram of a neuromorphic element according to the first embodiment.

FIG. 1 is a conceptual diagram of a neuromorphic element according to the first embodiment. The neuromorphic element 100 includes the input part 20, the reservoir element 10, and the output part 30. The input part 20 and the output part 30 are connected to the reservoir element 10.

The neuromorphic element 100 compresses the signal input from the input part 20 with the reservoir element 10, weights (learns) the signal compressed by the output part 30, and outputs the signal to the outside.

The input part 20 transmits a signal input from an external source to the reservoir element 10. The input part 20 includes, for example, input terminals. The input terminals sense information external to the neuromorphic element 100 and input information as a signal to the reservoir element 10. The signal may be input to the reservoir element 10 continuously over time with changes in external information or may be divided into a predetermined time domain and input to the reservoir element 10.

The reservoir element 10 has chips Cp. Multiple chips Cp interact. The signal input to the reservoir element 10 has a number of information. The large number of information contained in the signal is compressed to the information required by the interaction of multiple chips Cp. The compressed signal is transmitted to the output part 30. The reservoir element 10 does not perform the learning process. That is, the multiple chips Cp only interact and do not weight the signals that transmit between the multiple chips Cp.

The output part 30 receives a signal from the chip Cp of the reservoir element 10. The output part 30 performs the learning process. The output part 30 weights each signals from each of chip Cp by learning. The output part 30 includes, for example, a non-volatile memory. The non-volatile memory is, for example, a magnetoresistive effect element. The output part 30 outputs a signal to the outside of the neuromorphic element 100.

The neuromorphic element 100 compresses the data with the reservoir element 10 and weights the data with the output part 30 to increase the correct answer rate of the problem.

The neuromorphic element 100 also has excellent power consumption efficiency. Learning is performed only in the output part 30 in the neuromorphic element 100. Learning is to adjust the weight of the signal transmitted from each chip Cp. The weight of the signal is determined according to the importance of the signal. When the weight of the signal is adjusted from time to time, the circuitry between the chips Cp becomes active. The more active circuitry is, the higher the power consumption of the neuromorphic element 100. In the neuromorphic element 100, only the output part 30 learns in the final stage and the neuromorphic element 100 has excellent in power consumption efficiency.

Figure 2:
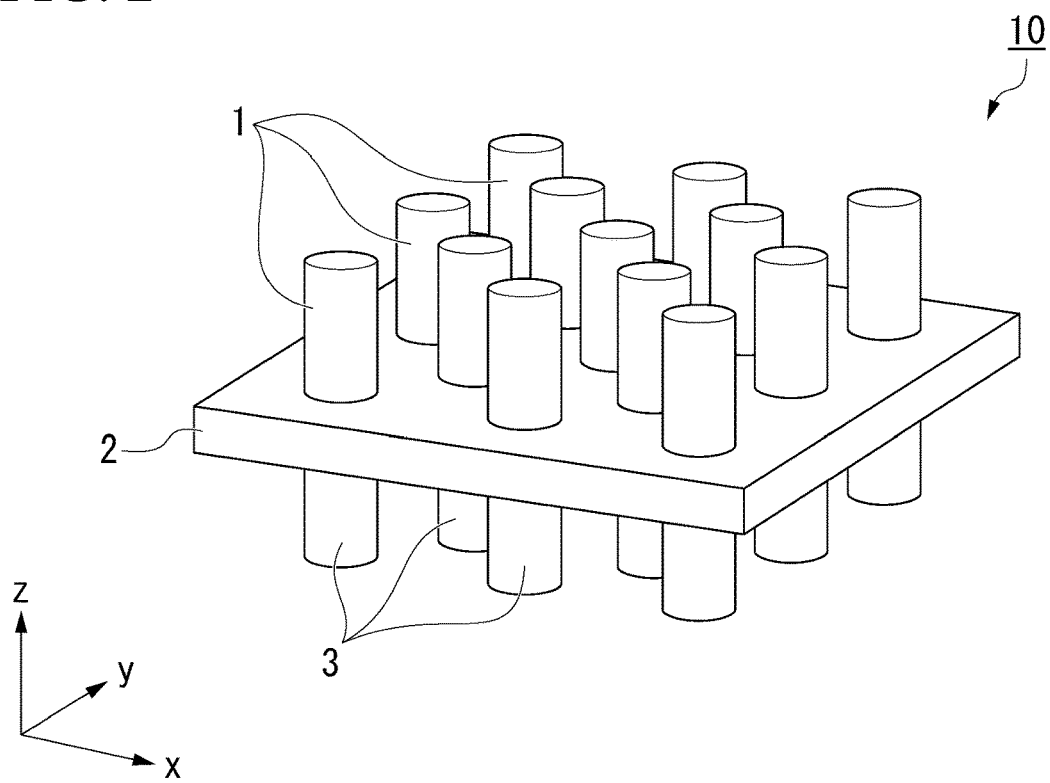
FIG. 2 is a perspective view of the reservoir element according to the first embodiment.
Figure 3:
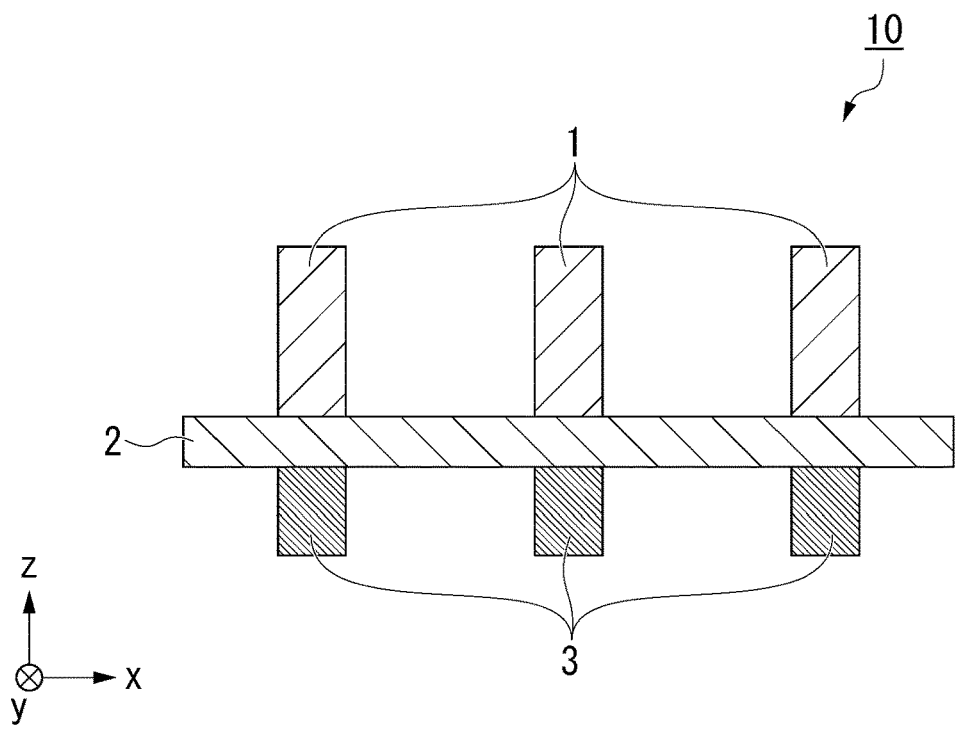
FIG. 3 is a side view of the reservoir element according to the first embodiment.
Figure 4:
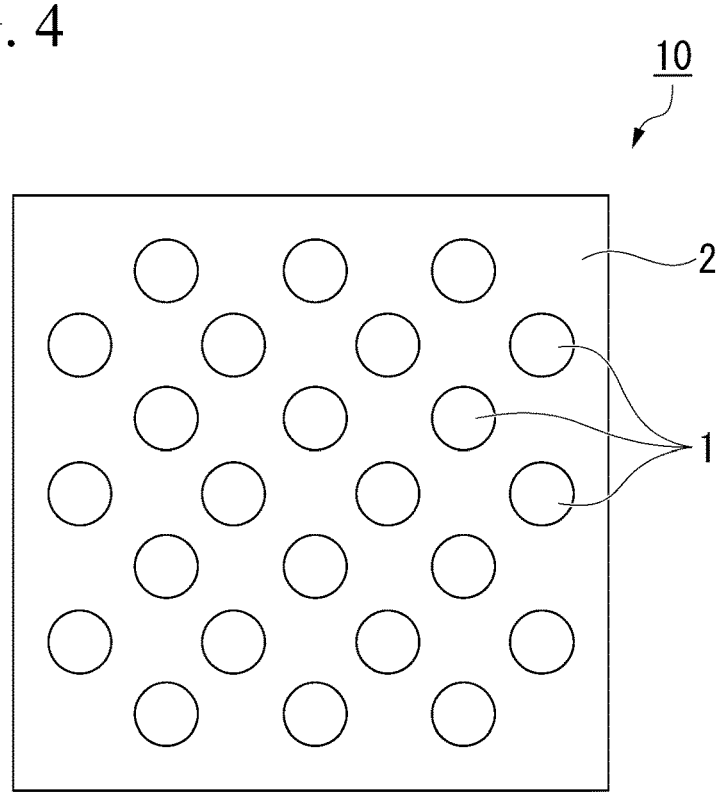
FIG. 4 is a plan view of a reservoir element according to the first embodiment.

FIG. 2 is a perspective view of a reservoir element 10 according to the first embodiment. FIG. 3 is a side view of the reservoir element 10 according to the first embodiment. FIG. 4 is a plan view of the reservoir element 10 according to the first embodiment.

The reservoir element 10 includes ferromagnetic layers 1, a spin conducting layer 2, and via wires 3. The ferromagnetic layers 1 correspond to the chip Cp of FIG. 1.

The directions are specified as described below. A predetermined direction in the extended surface of the spin conducting layer 2 is defined as the x-direction. Among the plane that the spin conducting layer 2 is extended, a direction intersecting (e.g., generally in the perpendicular direction) the x direction is defined as the y-direction. A direction intersecting (e.g., generally in the perpendicular direction) the plane that the spin conducting layer 2 is extended is defined as the z-direction.

The spin conducting layer 2 extends continuously on the xy-plane. The spin conduction layer 2 is made of a nonmagnetic conductor. The spin conduction layer 2 propagates the spin current that exudates from the ferromagnetic layer 1.

The spin conduction layer 2 is made of a material having a long spin diffusion length and a long spin transport length. The spin diffusion length is a distance until spins injected into the spin conduction layer 2 diffuse and information on the injected spins is halved. The spin transport length is the distance until the spin current of the spin-polarized current flowing in the nonmagnetic body is halved. When a low voltage is applied to the spin conduction layer 2, the spin diffusion length and the spin transport length are almost the same. On the other hand, when a high voltage is applied to the spin conduction layer 2, the spin transport length becomes longer than the spin diffusion length due to the drift effect.

The spin conduction layer 2 is made of a metal or a semiconductor, for example. The metal used for the spin conduction layer 2 is, for example, a metal or alloy containing any element selected from the group consisting of Cu, Ag, Al, Mg, and Zn. The semiconductor used for the spin conduction layer 2 is, for example, a simple element or an alloy of any element selected from the group consisting of Si, Ge, and C. For example, Si, Ge, Si—Ge compounds, graphene, and the like can be given.

The ferromagnetic layer 1 is formed on one surface of the spin conduction layer 2. The layers 1 project in the z-direction and exist on the xy-plane spaced from each other. The multiple ferromagnetic layer 1 are present with respect to a single spin conduction layer 2. The adjacent ferromagnetic layers 1 are, for example, insulated with interlayer insulator films.

The ferromagnetic layers 1 are arranged in a hexagonal lattice form, for example, in plane view from the z-direction (see FIG. 4). The signal input to the ferromagnetic layers 1 propagate in the spin conduction layer 2 as spin current. When the ferromagnetic layers 1 are arranged in a hexagonal lattice form, the signal input from the ferromagnetic layers 1 are likely to interfere with the signal input from the other ferromagnetic layers 1.

Figure 5:
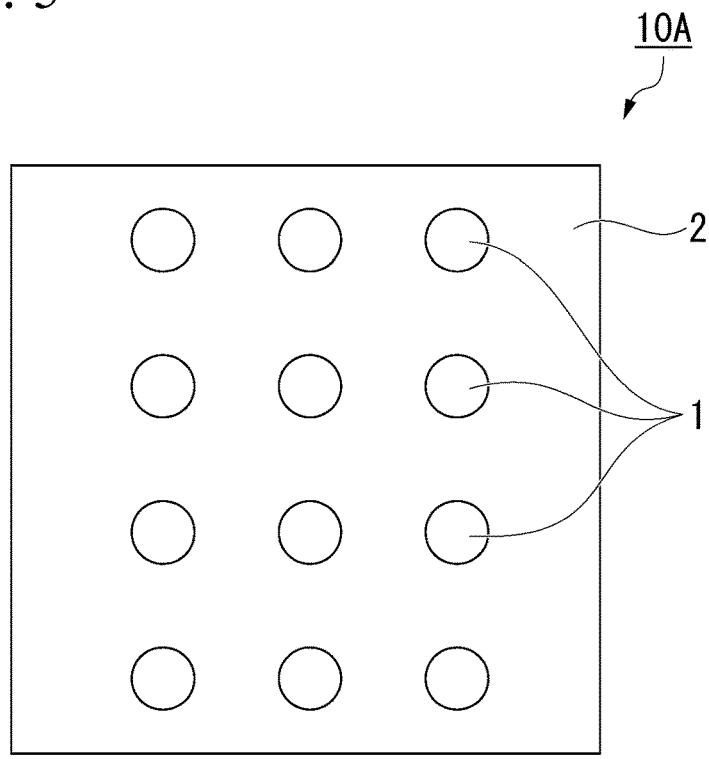
FIG. 5 is a plan view of another example of a reservoir element according to the first embodiment.
Figure 6:
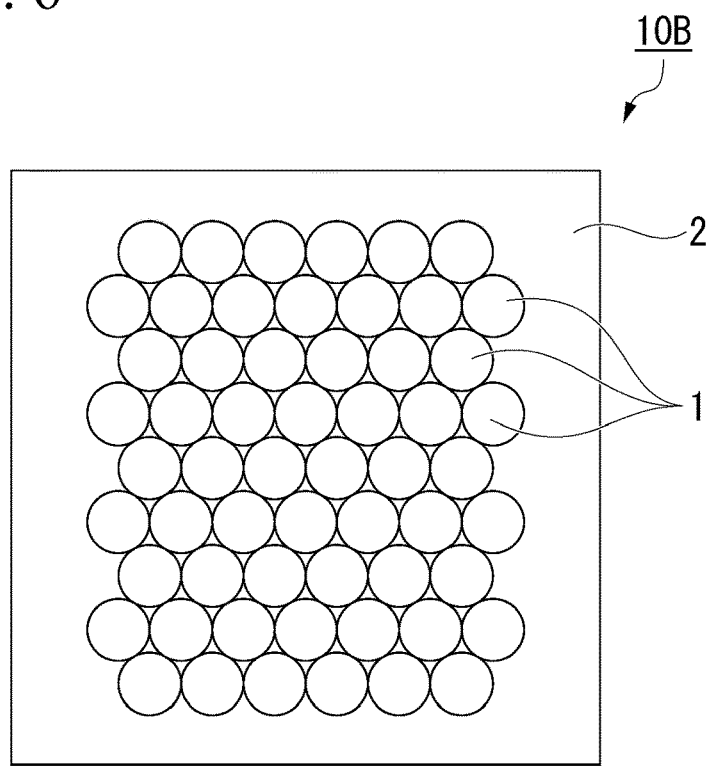
FIG. 6 is a plan view of another example of a reservoir element according to the first embodiment.
Figure 7:
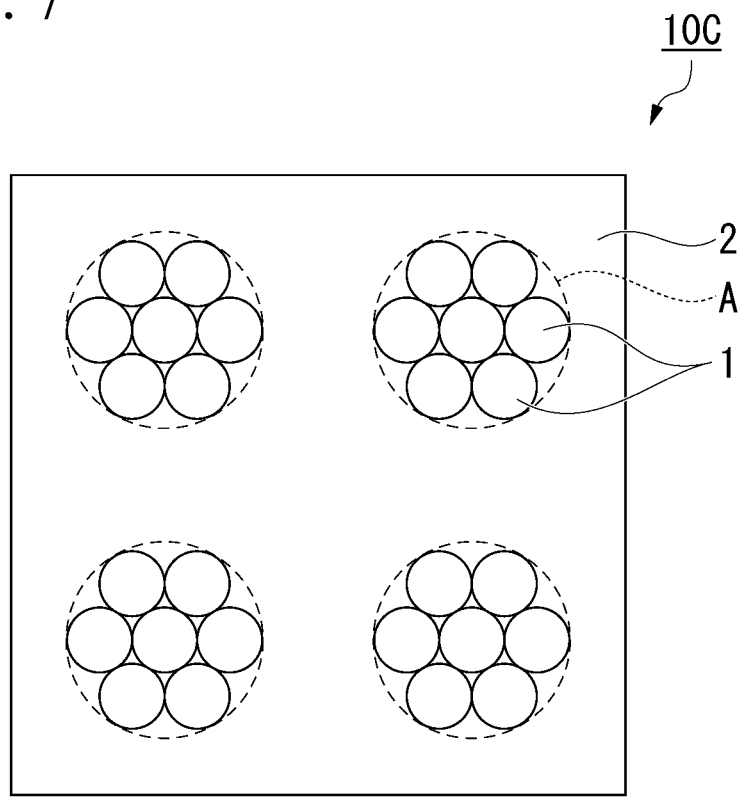
FIG. 7 is a plan view of another example of a reservoir element according to the first embodiment.

The arrangement of the ferromagnetic layers 1 is not limited to the case of FIG. 4. FIGS. 5-7 are plane views of other examples of the reservoir elements according to the first embodiment.

The reservoir element 10A shown in FIG. 5 has multiple ferromagnetic layers 1 arranged in a square lattice. The distance between adjacent ferromagnetic layer 1 is equal and the input signal is homogenized.

The reservoir element 10B shown in FIG. 6 has multiple ferromagnetic layers 1 placed close together in a hexagonal lattice form. As the density of the ferromagnetic layer 1 increases, the signal input to the ferromagnetic layer 1 is likely to interfere with each other. Even in this case, the ferromagnetic layers 1 are insulated from each other.

The reservoir element 10C shown in FIG. 7 forms multiple bundles A in which the ferromagnetic layers 1 are densely packed. In bundle A, the ferromagnetic layers 1 are arranged in a hexagonal lattice form. The adjacent ferromagnetic layers 1 are insulated. The conditions of mutual interference differ between the signals input to the ferromagnetic layer 1 constituting one bundle A and the signals input to the ferromagnetic layers 1 constituting a different bundle A. By adjusting the conditions of mutual interference in the reservoir element 10C, the reservoir element 10C emphasizes a particular signal and transmits it to the output part 30.

For example, the shape of each ferromagnetic layers 1 is a cylindrical shape (see FIG. 1). The shape of the ferromagnetic layers 1 is not limited to a cylindrical shape. The shape of the ferromagnetic layer 1 may be, for example, an ellipsoidal shape, a rectangular cylinder, a cone, an ellipsoidal cone, a frustum, a square frustum, and the like.

The ferromagnetic layer 1 contains a ferromagnetic material. The ferromagnetic layer 1 contains, for example, a metal selected from the group consisting of Cr, Mn, Co, Fe, and Ni; an alloy containing one or more of these metals; and an alloy containing one of Cr, Mn, Co, Fe, and Ni, and at least one of these metals and B, C, and N. The ferromagnetic layer 1 is made of, for example, Co—Fe, Co—Fe—B, Ni—Fe, a Co—Ho alloy ($CoHo_2$), or an Sm—Fe alloy ($SmFe_{12}$). When the ferromagnetic layer 1 includes a Co—Ho alloy ($CoHo_2$) or an Sm—Fe alloy ($SmFe_{12}$), the ferromagnetic layer 1 tends to be an in-plane magnetization film.

The distance between two adjacent ferromagnetic layers 1 is preferably less than or equal to the spin transport length of the material constituting the spin conduction layer 2 and preferably less than or equal to the spin diffusion length.

The via wiring 3 is electrically connected to the spin conduction layer 2 on the surface opposite to the surface with the nonmagnetic layer 3. The via wirings 3 may be directly connected to the spin conduction layer 2 or may be connected via other layers. The via wirings 3 shown in FIGS. 1 and 3 project from the spin conduction layer 2 in the z-direction. Multiple via wirings 3 exist on the xy-plane, each of them being spaced apart.

The via wiring 3 includes a conductor. The via wiring 3 is made of, for example, Cu, Al, Au. The adjacent via wirings 3 are insulated.

Each of the via wirings 3 shown in FIGS. 1 and 3 is disposed at a position corresponding to each of the ferromagnetic layers 1. That is, each of the ferromagnetic layers 1 and each of the via wirings 3 overlap with a plane view from the z-direction.

An example of a method for manufacturing the reservoir element 10 in the neuromorphic element 100 will now be described. FIGS. 8A-8D are cross-sectional views illustrating a method of manufacturing a reservoir element 10 according to the first embodiment.

Figure 8A:
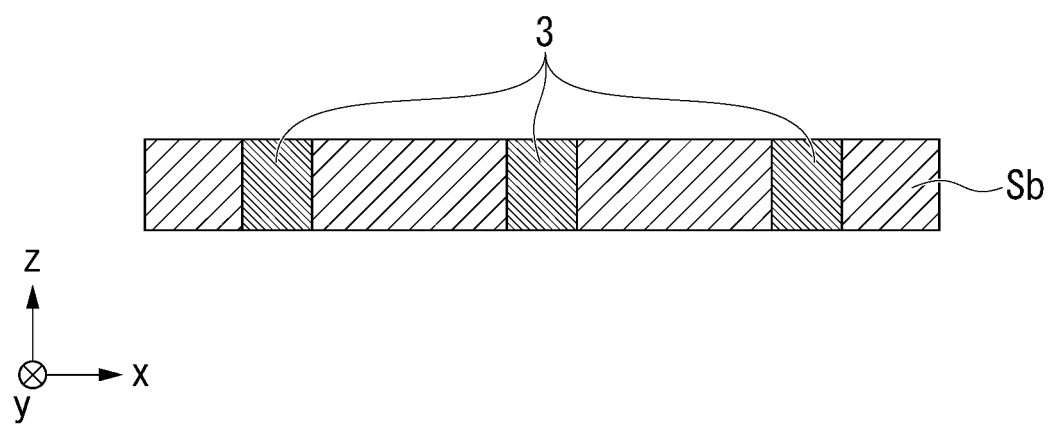
FIG. 8A is a cross-sectional view illustrating a method of manufacturing a reservoir element according to the first embodiment.

First, a hole is formed in the substrate Sb and the inside of the hole is filled with a conductor (FIG. 8A). The substrate Sb is, for example, a semiconductor substrate. The substrate Sb is preferably, for example, Si, AlTiC. When Si or AlTiC are used, it is easy to obtain a flat surface. The holes are formed, for example, using reactive ion etching (RIE). The conductor filling the hole becomes the via wiring 3.

Figure 8B:
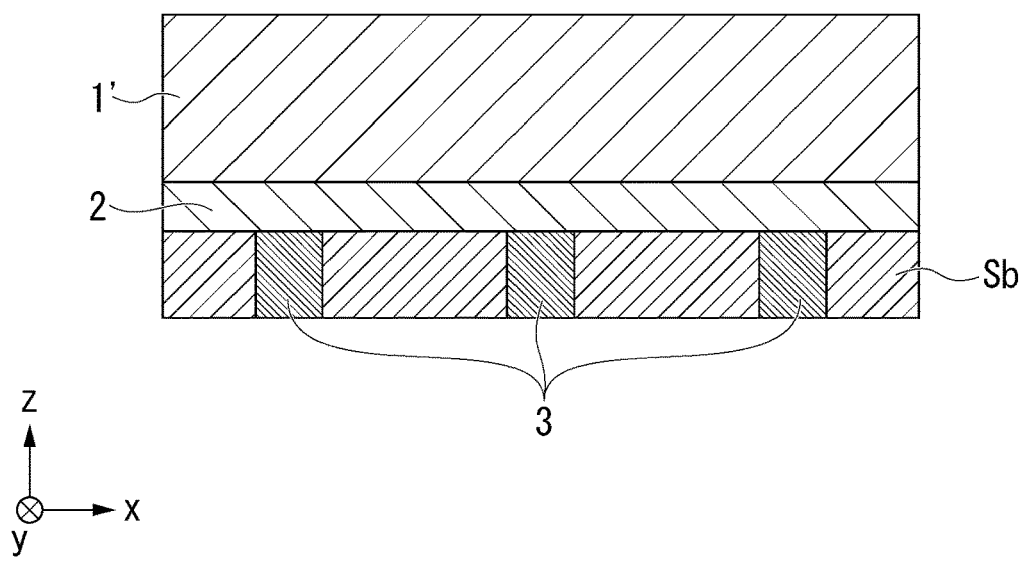
FIG. 8B is a cross-sectional view illustrating a method of manufacturing a reservoir element according to the first embodiment.

The surface of the substrate Sb and the via wirings 3 are then planarized by chemical mechanical polishing (CMP). The spin conduction layer 2 and the ferromagnetic layer 1' are laminated on the planarized substrate Sb and the via wirings 3 in this order (FIG. 8B). The spin conduction layer 2 and the ferromagnetic layer 1' are laminated using, for example, chemical vapor deposition (CVD).

Figure 8C:
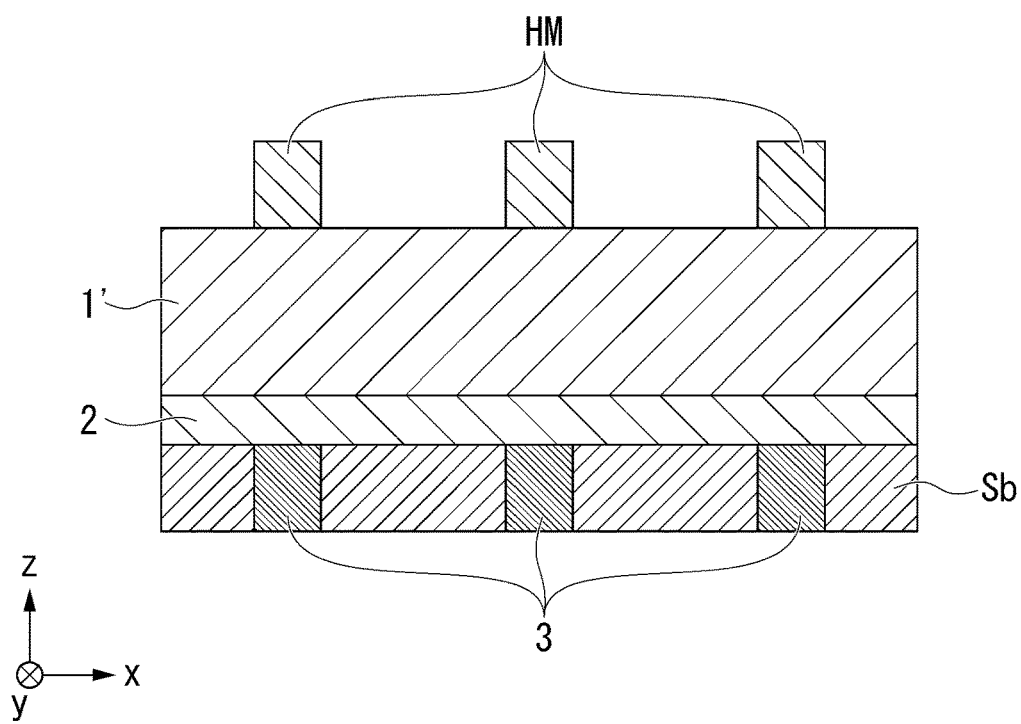
FIG. 8C is a cross-sectional view illustrating a method of manufacturing a reservoir element according to the first embodiment.
Figure 8D:
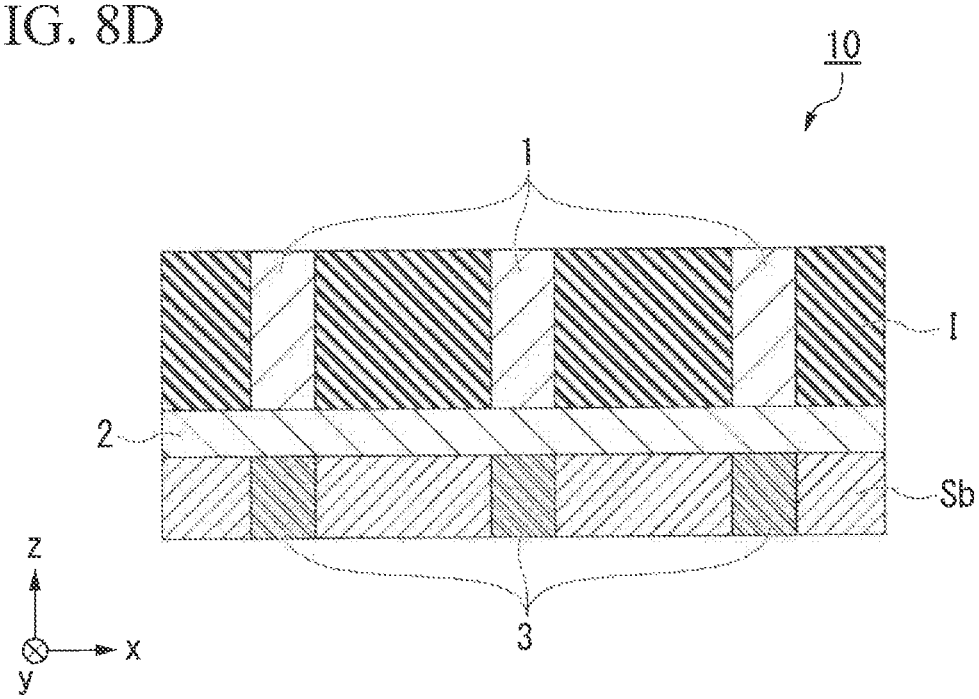
FIG. 8D is a cross-sectional view illustrating a method of manufacturing a reservoir element according to the first embodiment.

The hard mask HM is then formed at a predetermined position on the surface of the ferromagnetic layer 1' (FIG. 8C). The portion of the ferromagnetic layer 1' that is not coated with the hard mask HM is removed by RIE or ion milling. The ferromagnetic layer 1' is formed into multiple ferromagnetic layers 1 by removing unwanted portions. Finally, the ferromagnetic layers 1 are protected by the interlayer insulating film I (FIG. 8D). The above procedure yields the neuromorphic element 100 according to the first embodiment.

Figure 14:
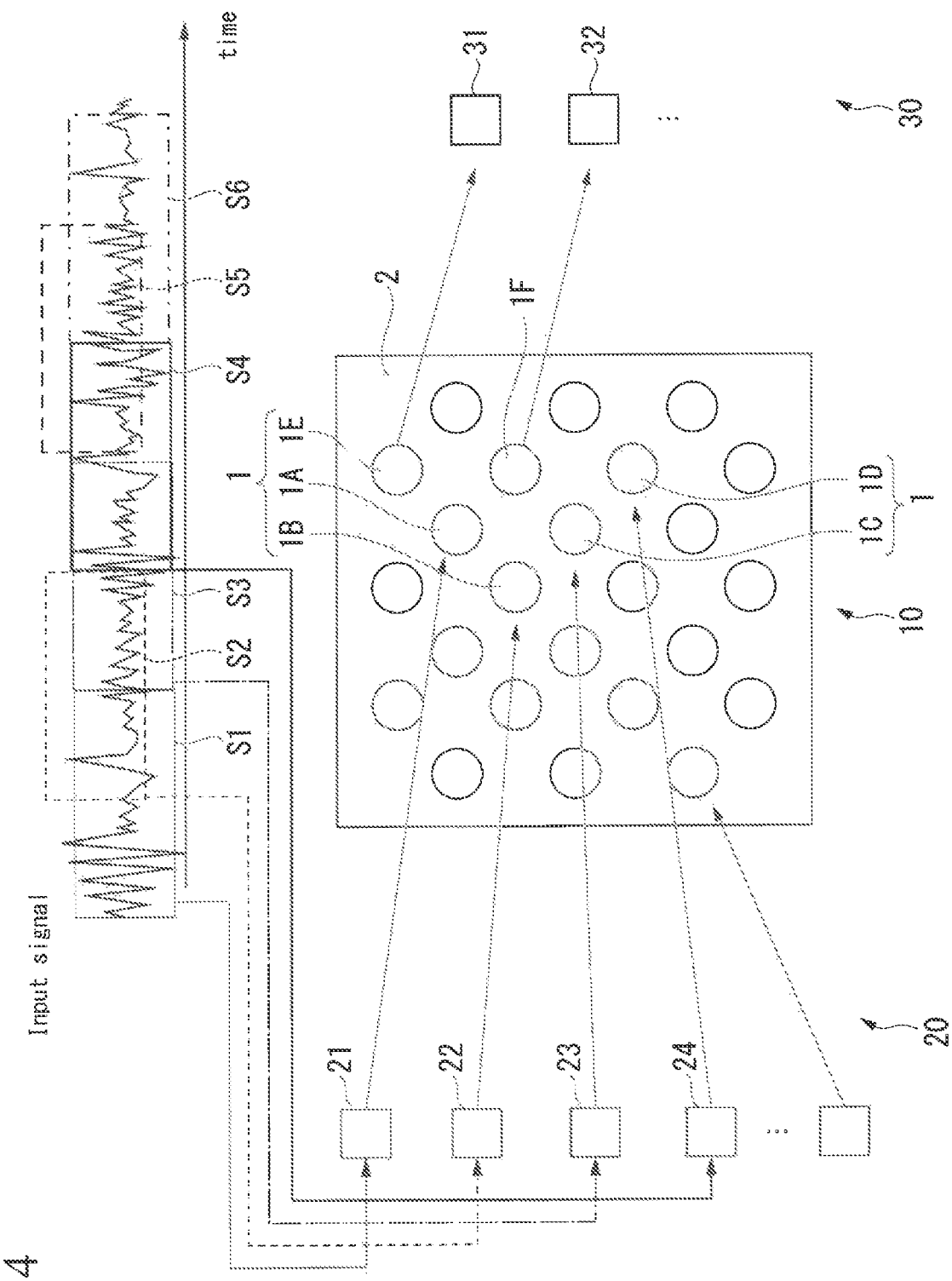
FIG. 14 is a schematic diagram illustrating an example of the operation of a neuromorphic element.

The function of the neuromorphic element 100 will then be described. FIG. 14 is a schematic diagram illustrating an example of operation of the neuromorphic element 100. The input part 20 includes multiple input terminals 21, 22, 23, 24, and the like. Each of the input terminals 21, 22, 23, 24 ..., which comprise the input part 20, is connected to each of the ferromagnetic layers 1 of the reservoir elements 10. The input part 20 receives an input signal from an external source. For example, the input signal is divided into time domains and is input to multiple input terminals 21, 22, 23, 24, etc. of the input part 20 as signals S1, S2, S3, S4, S5, and S6, respectively. An example is shown where the input signal is input without processing, but the signal can be input after the Fast Fourier Transform Analysis (FT analysis) is performed. FFT analysis is effective in extracting frequency characteristics. FFT analysis can also filter low amplitude signals due to noise. When the input terminals 21, 22, 23, 24 ... receive an external signal, a current flows from the corresponding ferromagnetic layers 1A, 1B, 1C, 1D ... to the via wiring 3, and the signals S1, S2, S3, S4, S5, S6 ... are input to the reservoir element 10. For example, the input signal is divided in the order of the signal S1, the signal S2, the signal S3, and the signal S4 in chronological order. The write current flows in the order of the ferromagnetic layer 1A in which the signal Si is input, the ferromagnetic layer 1B in which the signal S2 is input, the ferromagnetic layer 1C in which the signal S3 is input, and the ferromagnetic layer 1D in which the signal S4 is input. If each of the via wirings 3 is disposed at a position corresponding to each of the plurality of ferromagnetic layers 1, most of the currents flow in the z-direction.

The current is spin polarized by the ferromagnetic layers 1A, 1B, 1C, and 1D and reaches to the spin conduction layer 2. The electric charge flows through the via wiring 3 and hardly flows in the spin conduction layer 2. That is, spins are injected from the ferromagnetic layers 1 into the spin conduction layer 2 in the vicinity of the ferromagnetic layers 1, and spins are accumulated in the spin conduction layer 2. The accumulated spins propagate in the spin conduction layer 2 as a spin current. Spins injected from the ferromagnetic layers 1 spread around the respective ferromagnetic layers 1 in the spin conduction layer 2.

The range in which the spin spreads varies depending on the current application time and amount. This is because the amount of spin accumulated in the vicinity of the ferromagnetic layer 1 and the spin transport length change. When the amount of applied current is large, the spin transport length becomes long, and the spin current propagates in a wide range from the vicinity of the ferromagnetic layers 1A, 1B, 1C, and 1D.

When a current flows from each of the ferromagnetic layers 1A, 1B, 1C, and 1D toward the via wiring 3, the spin current is generated from each position near the ferromagnetic layers 1A, 1B, 1C, and 1D to which the current is applied. Spreads in the spin conduction layer 2. Spin currents propagated from different positions interfere with each other. For example, the spin current propagating from the ferromagnetic layer 1A and the spin current propagating from the ferromagnetic layer 1B interfere with each other. The spin current propagating from the ferromagnetic layer 1A and the spin current propagating from the ferromagnetic layer 1B are more likely to interfere with each other than the spin current propagating from the ferromagnetic layer 1A and the spin current propagating from the ferromagnetic layer 1C. This is because the distance between the ferromagnetic layer 1A and the ferromagnetic layer 1B is shorter than the distance between the ferromagnetic layer 1A and the ferromagnetic layer 1C. That is, as the distance between the ferromagnetic layers 1 is shorter, the input signals S1, S2, S3, S4, S5, S6. The spin lifetime is several hundreds psec for metals such as Ta and Pt, and several nsec for semiconductors such as S1. Information on spins injected into the spin conduction layer 2 cannot be read in about several hundred psec to several nsec. Therefore, the closer the signals S1, S2, S3, S4, S5, S6 in the chronological order, the more the signals being interfered with each other. For example, it is preferable that the distance between the ferromagnetic layer 1A, to which the signal S1 is input, and the ferromagnetic layer 1B, to which the signal S2 is input is shorter than the distance between the ferromagnetic layer 1A, to which the signal S1 is input, and the ferromagnetic layer 1C to which the signal S3 is input.

Finally, the signal is output from the reservoir element 10 to the output part 30. The output part 30 includes, for example, multiple output terminals 31, 32 .... The output terminals 31, 32 ... are connected to any ferromagnetic layers 1. FIG. 14 shows an example of connecting the input terminals 21, 22, 23, 24 ... to the ferromagnetic layers 1E, 1F that is different from the ferromagnetic layers 1A, 1B, 1C, and 1D to which the input terminals 21, 22, 23, 24 ... are connected. The input and output can be switched, and the output terminals 31 and 32 for the output can be connected to the ferromagnetic layers 1A, 1B, 1C, and 1D to which the input terminals 21, 22, 23, 24, etc. for the input are connected. The signals are read as a potential difference between the via wiring 3 and the ferromagnetic layer 1. Although no current flows in the spin conduction layer 2, a spin current flows. When the spin current is generated, the potential of the spin conduction layer 2 with respect to the spin of the ferromagnetic layer 1 changes, and a potential difference is generated. The potential difference is read as a potential difference between the reference potential and each of the ferromagnetic layers 1 using any one of the via wirings 3 as a reference potential.

The potential of the spin conduction layer 2 in the vicinity of each ferromagnetic layer 1 is affected by the spin current spreading from different positions. A signal read as a potential difference from one ferromagnetic layer 1 includes information written in another ferromagnetic layer 1 and the information is compressed.

Figure 15:
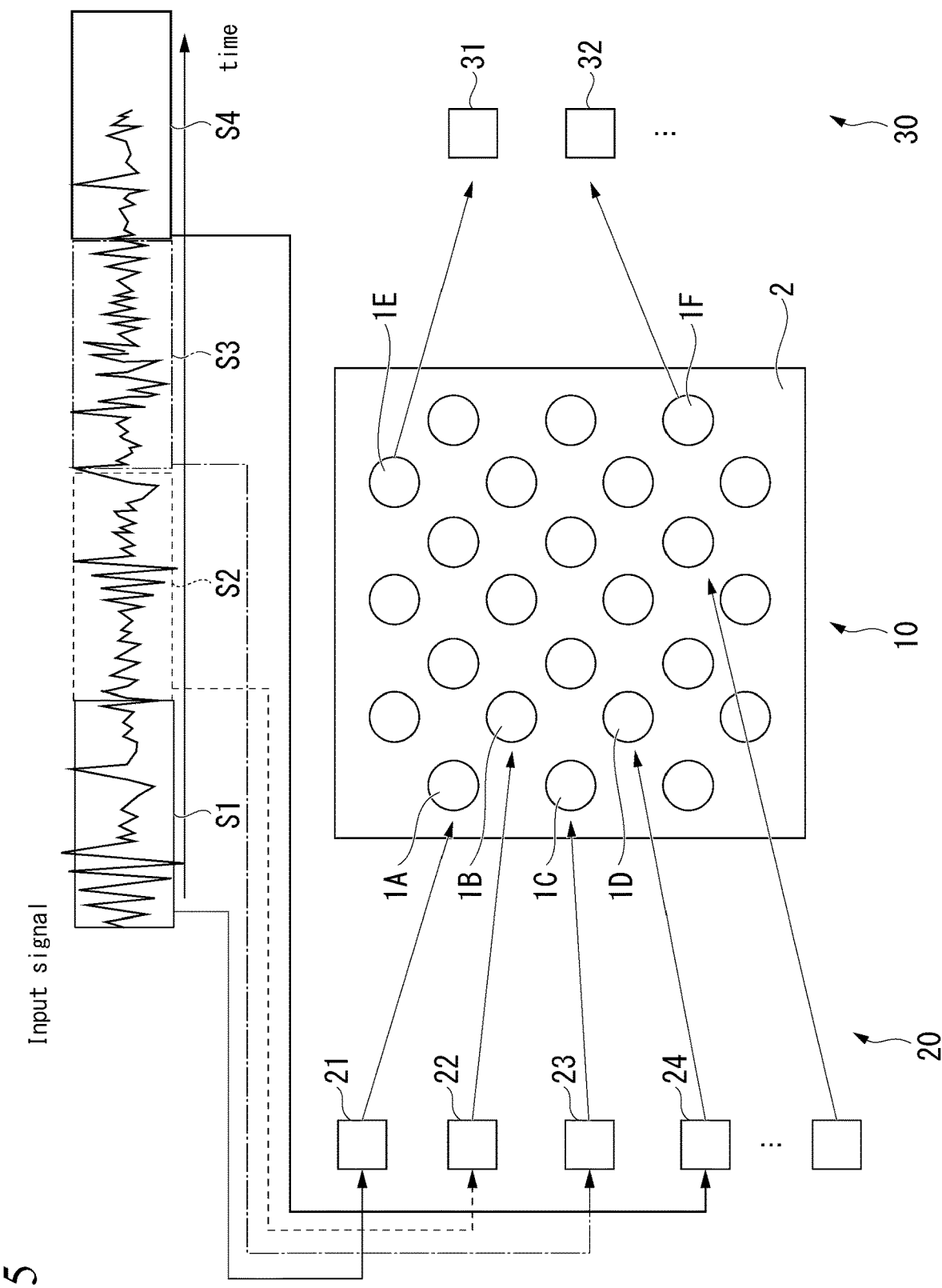
FIG. 15 is a schematic diagram illustrating another example of the operation of a neuromorphic element.

Finally, the compressed signal is transmitted to the output part 30 through multiple output terminals 31, 32 .... The output part 30 weights the signal read out from each of the ferromagnetic layers 1 by learning. FIG. 15 is a schematic diagram illustrating another example of the operation of the neuromorphic element 100. In FIG. 15, the method of dividing the input signal, the connection points of the input terminals 21, 22, 23, and 24 and the connection points of the output terminals 31, 32, etc. are different from those shown in FIG. 14. In the example shown in FIG. 15, the input signals are divided into time series without overlapping into signals S1, S2, S3, S4, and so on. In the neuromorphic element shown in FIG. 15, the ferromagnetic layers 1A, 1B, 1C, and 1D in which signals S1, S2, S3, and S4, which are separated from each other in time series, are inputted are arranged in such a way that the distances from each other are separated becomes longer from the ferromagnetic layers 1A, 1B, 1C and 1D.

Figure 16:
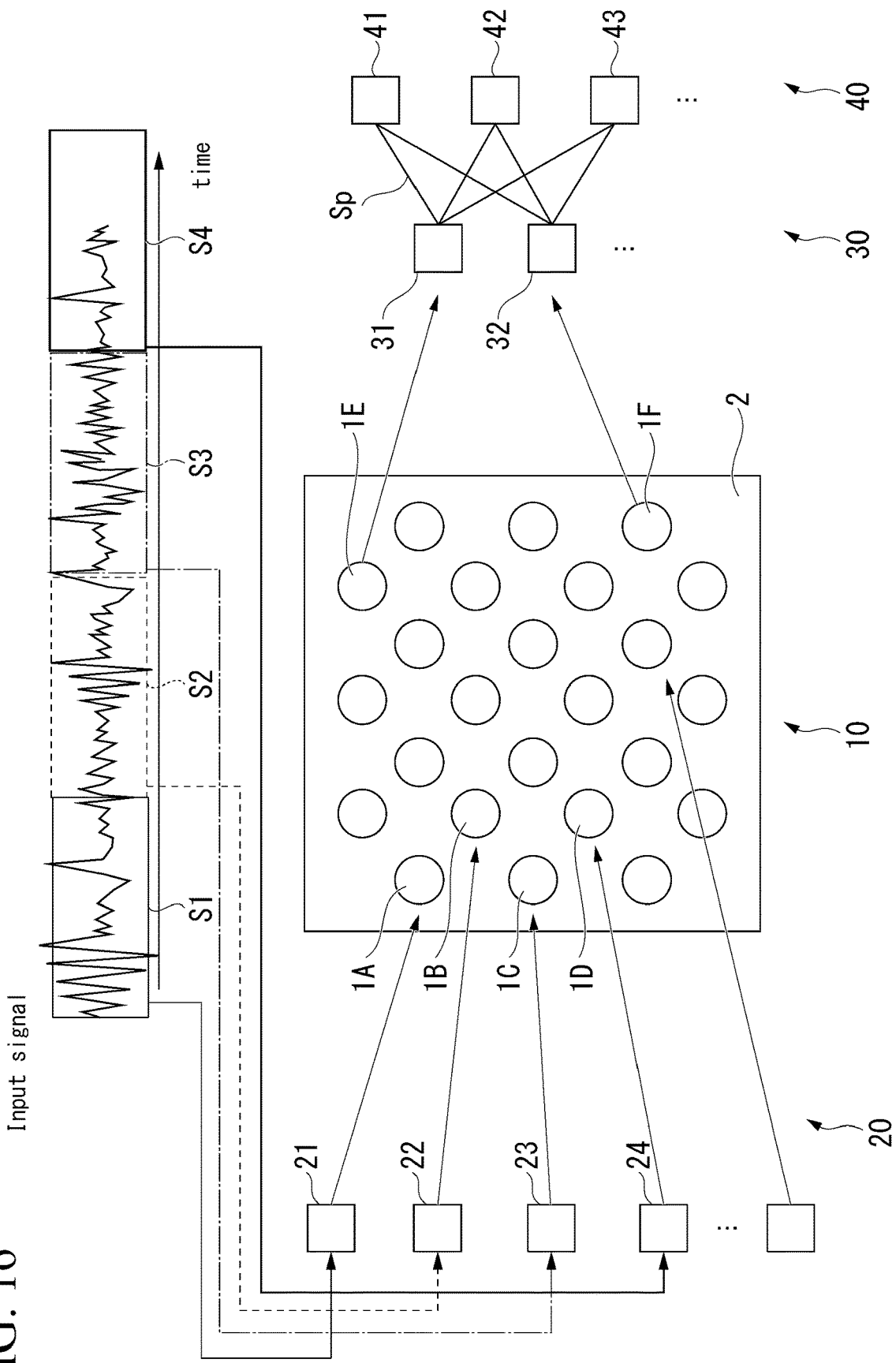
FIG. 16 is a schematic diagram illustrating another example of a neuromorphic element.

FIG. 16 is a schematic diagram illustrating another example of a neuromorphic element. The neuromorphic element shown in FIG. 16 has a second output part 40, which is different from the example shown in FIG. 15. Each of the terminals 41, 42, and 43 of the second output part 40 is connected to each of the output terminals 31, 32 . . . of the output part 30 via a synapse Sp. When information is transmitted from each of the output terminals 31, 32 . . . of the output part 30 to each of the terminals 41, 42, and 43 of the second output part 40, the data is weighted at the synapse Sp. The neuromorphic element shown in FIG. 16 performs the learning process between the output part 30 and the second output part 40. The neuromorphic element shown in FIG. 16 is able to recognize more complex information by having a structure of a deep neural network.

Figure 17:
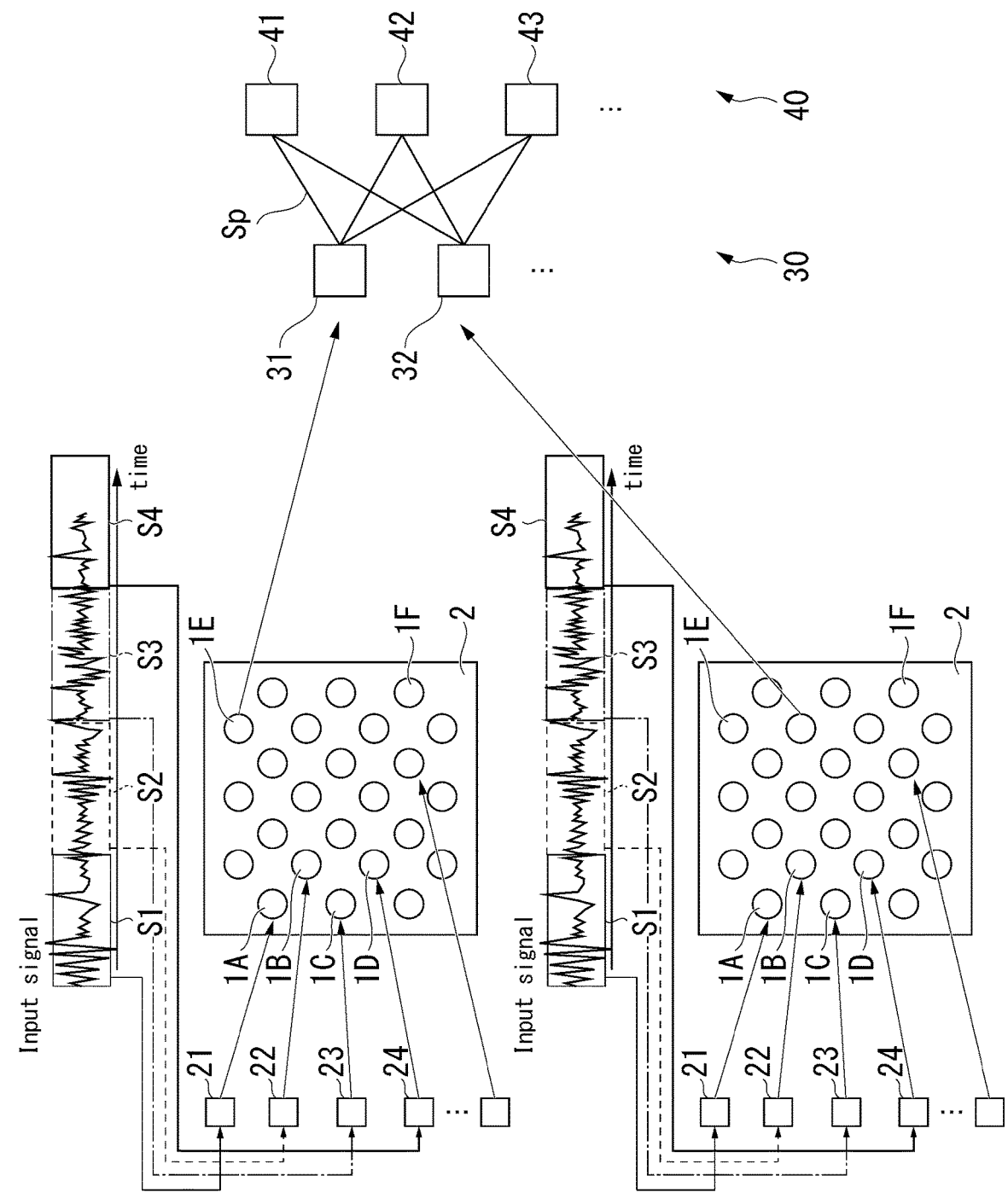
FIG. 17 is a schematic diagram illustrating another example of a neuromorphic element.

FIG. 17 is a schematic diagram illustrating another example of a neuromorphic element. The neuromorphic element shown in FIG. 17 differs from the example shown in FIG. 15 in that, the reservoir elements 10 are arranged in parallel and the output parts 30 connected to the respective reservoir elements 10 are shared. By having such a structure, it is possible to simultaneously recognize signals having different outputs and signal speeds from multiple input terminals, and a multimodal reservoir device can be realized.

As described above, in the reservoir element 10 according to the first embodiment, the spin currents propagating from the respective ferromagnetic layers 1 interfere with each other in the spin conduction layer 2. Signals input from the input unit 20 interfere with each other in the spin conduction layer 2 to generate a specific state in the spin conduction layer 2. That is, the signal input from the input unit 20 is compressed into one state in the spin conduction layer 2. Therefore, the neuromorphic element 100 according to the first embodiment appropriately compresses the signal by the reservoir element 10. By compressing the signal, only the output unit 30 needs to learn, and the power consumption of the neuromorphic element 100 is reduced.

Further, the reservoir element 10 according to the first embodiment can be variously changed.

Figure 9:
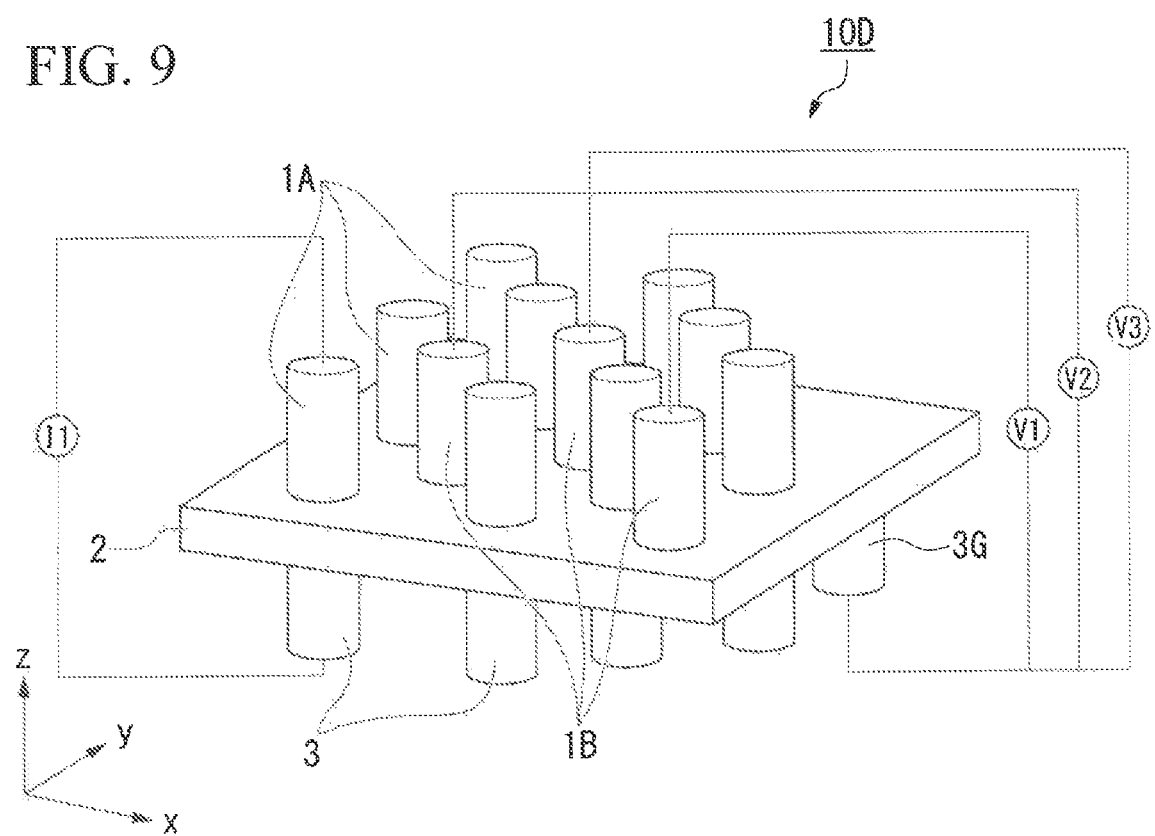
FIG. 9 illustrates another example of an embodiment of the use of a ribbon element according to a first embodiment.

FIG. 9 is a perspective view of another example of the reservoir element according to the first embodiment. The reservoir element 10D shown in FIG. 9 has a reference potential terminal 3G, and the ferromagnetic layer 1 is divided into an input terminal 1A and an output terminal 1B.

The reference potential terminal 3G is electrically connected to the spin conduction layer 2. The reference potential terminal 3G is preferably at a position sufficiently away from each output terminal 1B. The reference potential terminal 3G is made of the same material as that of the via wiring 3.

The ferromagnetic layer 1 is divided into an input terminal 1A for inputting a signal and an output terminal 1B for outputting a signal. When a current flows from each input terminal 1A to the via wiring 3, a spin current flows in the spin conduction layer 2 and interferes with each other. The output terminal 1B outputs the potential difference between the spin in the spin conduction layer 2 near the output terminal 1B and the magnetization of the output terminal 1B at a certain moment as a potential difference. With reference to the reference potential terminal 3G, the potentials V1, V2, and V3 of the respective output terminals 1B are measured. The potentials V1, V2, and V3 are output signals. Since the reference potential is fixed by the reference potential terminal 3G, the relative evaluation of the potentials V1, V2, and V3 becomes possible.

The shortest distance between the input terminal 1A and the output terminal 1B is preferably less than or equal to the spin transport length of the material constituting the spin conduction layer 2, and preferably less than or equal to the spin diffusion length. When the spin current sufficiently propagates to the output terminal 1B, the SN (Signal/Noise) ratio of the output signal is improved.

Figure 10:
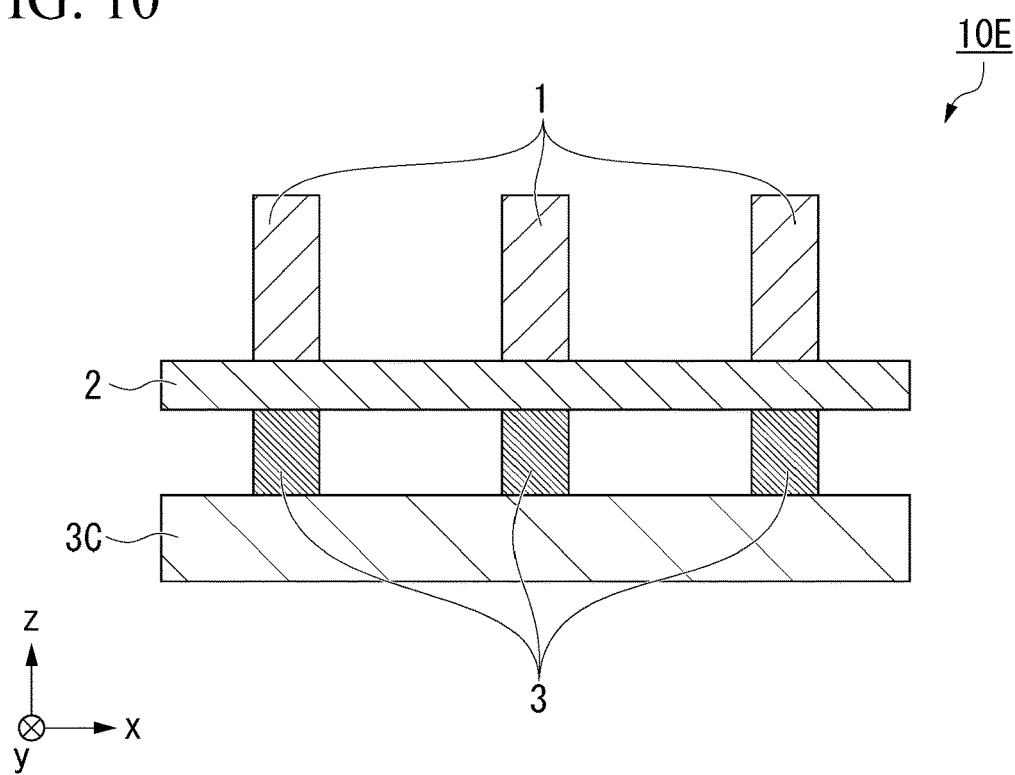
FIG. 10 is a cross-sectional view of another example of a riser bore element according to a first embodiment.

Further, when the input terminal 1A and the output terminal 1B are separated, the via wiring 3 may not be provided at a position facing the output terminal 1B. Further, as shown in FIG. 10, the via wirings 3 facing the input terminal 1A or the output terminal 1B may be connected to each other by a common electrode layer 3C.

Second Embodiment

Figure 11:
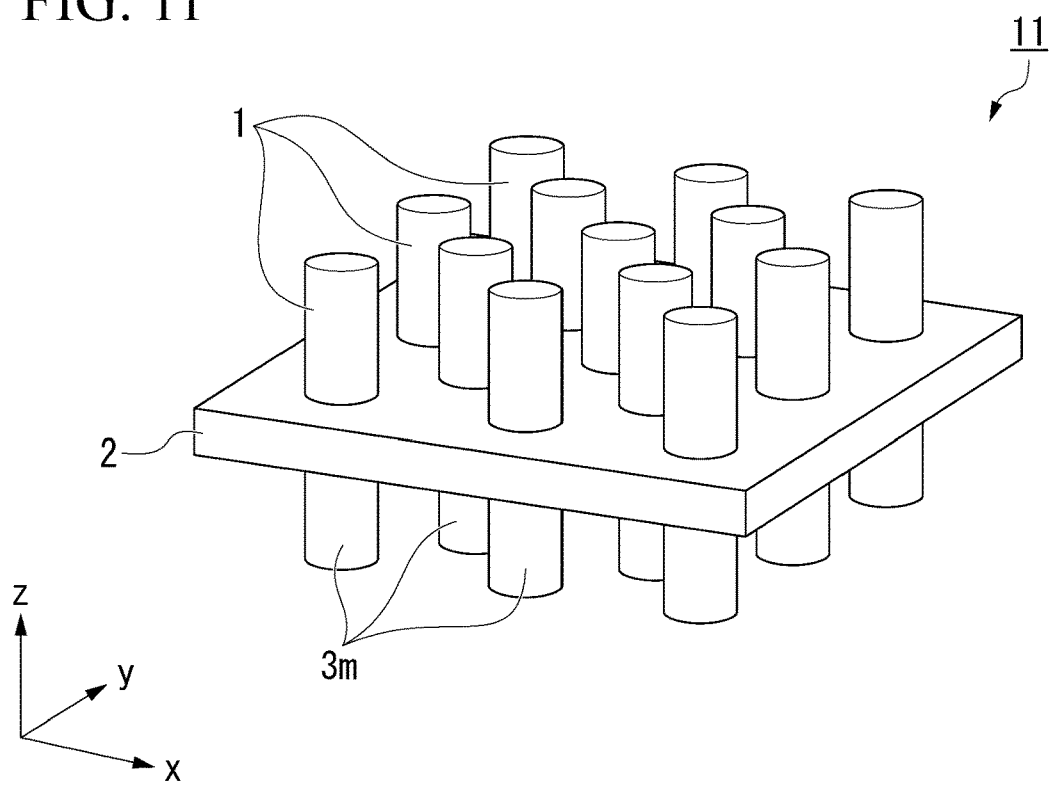
FIG. 11 is a perspective view of a reservoir element according to the second embodiment.

FIG. 11 is a cross-sectional view of a reservoir element according to the second embodiment. The reservoir element 11 according to the second embodiment differs from the reservoir element 10 according to the first embodiment in that the via wiring 3m contains a magnetic material. The other configuration is the same as the reservoir element 10 according to the first embodiment, and the description is omitted. Also, in FIG. 11, the same configuration as FIG. 1 is denoted by the same reference numerals.

The via wiring 3m includes a magnetic material. The via wiring 3m may include a magnetic material at a position close to the spin conduction layer 2. The via wiring 3m may have, for example, a structure in which a ferromagnetic layer and a conductive layer are sequentially stacked from a position close to the spin conduction layer 2. For the magnetic material, the same material as that of the ferromagnetic layer 1 can be used.

The orientation direction of the magnetization of the via wiring 3m is opposite to the orientation direction of the magnetization of the ferromagnetic layer 1. When a current is passed between the ferromagnetic layer 1 and the via wiring 3m having different magnetization orientation directions, spins in the same direction can be efficiently injected into the spin conduction layer 2.

The case where the magnetization of the ferromagnetic layer 1 is oriented in the +x direction and the magnetization of the via wiring 3m is oriented in the −x direction will be described as an example. For example, the current flows in the order of the ferromagnetic layer 1, the spin conduction layer 2, and the via wiring 3m. When a current flows from the ferromagnetic layer 1 to the spin conduction layer 2, spins in the −x direction are injected from the ferromagnetic layer 1 into the spin conduction layer 2. On the other hand, when a current flows from the spin conduction layer 2 to the via wiring 3m, the magnetization of the via wiring 3m is oriented in the −x direction, so that spins in the −x direction flow from the via wiring 3m to the spin conduction layer 2. Therefore, if the via wiring 3m contains a ferromagnetic material, spins in the same direction can be efficiently injected into the spin conduction layer 2.

The reservoir element 11 according to the second embodiment can be used to the neuromorphic element 100. Further, the reservoir element 11 according to the second embodiment can obtain the same effects as the reservoir element 10 according to the first embodiment. The reservoir element 11 according to the second embodiment efficiently supplies spin to the spin conduction layer 2. Therefore, the interference of the spin current in the spin conduction layer 2 is promoted, and the reservoir element 11 can represent a more complex phenomenon.

Third Embodiment

Figure 12:
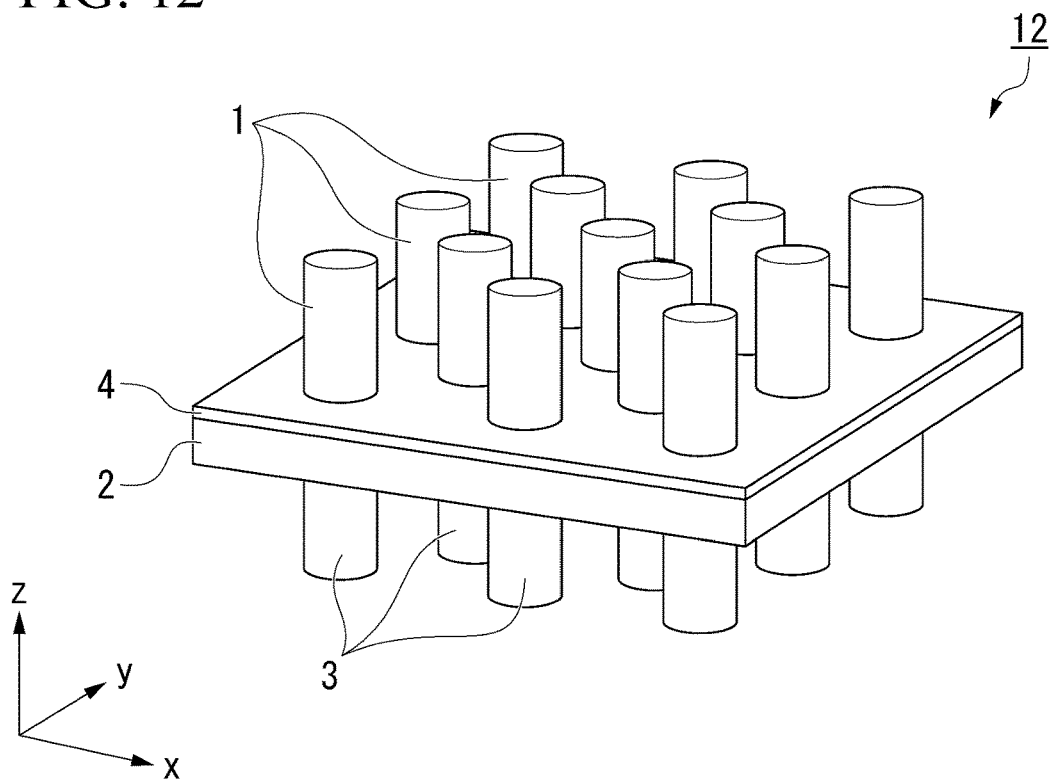
FIG. 12 is a side view of a reservoir element according to the third embodiment.

FIG. 12 is a cross-sectional view of a reservoir element according to the third embodiment. The reservoir element 12 in accordance with the third embodiment has the first tunnel barrier layer 4, which is different from the reservoir element 10 in accordance with the first embodiment. The other configuration is the same as the reservoir element 10 according to the first embodiment, and the description is omitted. Also, in FIG. 10, the same configuration as FIG. 1 is denoted by the same reference numerals.

The first tunnel barrier layer 4 is located between the ferromagnetic layer 1 and the spin conduction layer 2. For example, the first tunnel barrier layer 4 continuously extends in the xy-plane. The first tunnel barrier layer 4 may be scattered in the xy-plane only at a position between the ferromagnetic layer 1 and the spin conduction layer 2.

The first tunnel barrier layer 4 is made of a nonmagnetic insulator. The first tunnel barrier layer 4 is, for example, $Al_2O_3$, $SiO_2$, MgO, $MgAl_2O_4$, or the like. The first tunnel barrier layer 4 may be a material in which a part of Al, Si, and Mg in the above materials is replaced with Zn, Be, or the like. MgO and $MgAl_2O_4$ can realize the coherent tunnel phenomenon between the ferromagnetic layer 1 and the spin conduction layer 2, and can efficiently inject spin from the ferromagnetic layer 1 to the spin conduction layer 2.

The thickness of the first tunnel barrier layer 4 is preferably less than 3 nm. When the thickness resistance of the first tunnel barrier layer 4 is high, the backflow of the spin current from the spin conduction layer 2 can be suppressed. However, when the thickness of the first tunnel barrier layer 4 is 3 nm or more, the spin scattering effect as the spin filter of the first tunnel barrier layer 4 is not increased, but only the resistance is increased, and noise is increased.

The first tunnel barrier layer 4 has a higher spin resistance than the spin conduction layer 2. The spin resistance is a quantity that quantitatively indicates the ease of spin current flow (difficulty of spin relaxation).

The spin resistance Rs is defined by the following formula (see Non-Patent Document 1).

[Equation 1]

$$R_s \equiv \frac{\rho \lambda}{A} \qquad (1)$$

Where $\lambda$ is the spin diffusion length of the material, $\rho$ is the electrical resistivity of the material, and A is the cross-sectional area of the material.

In the case of a nonmagnetic material, when the cross-sectional areas A are equal, the magnitude of the spin resistance is determined by the value of $\rho\lambda$, which is the spin resistivity, in the equation (1).

Spin tends to flow to the part with low spin resistance. Since the first tunnel barrier layer 4 includes an insulator, the first tunnel barrier layer 4 has a high electrical resistivity and a high spin resistance. The first tunnel barrier layer 4 suppresses the spin that has reached the spin conduction layer 2 from returning to the ferromagnetic layer 1.

The reservoir element 12 in accordance with the third embodiment can be applied to the neuromorphic element 100. In addition, the reservoir element 12 according to the third embodiment has the same effect as the reservoir element 10 according to the first embodiment. The reservoir element 12 according to the third embodiment can efficiently generate the spin current by the spins injected into the spin conduction layer 2. Therefore, interference of the spin current in the spin conduction layer 2 is promoted, and the reservoir element 12 can represent a more complex phenomenon.

Fourth Embodiment

Figure 13:
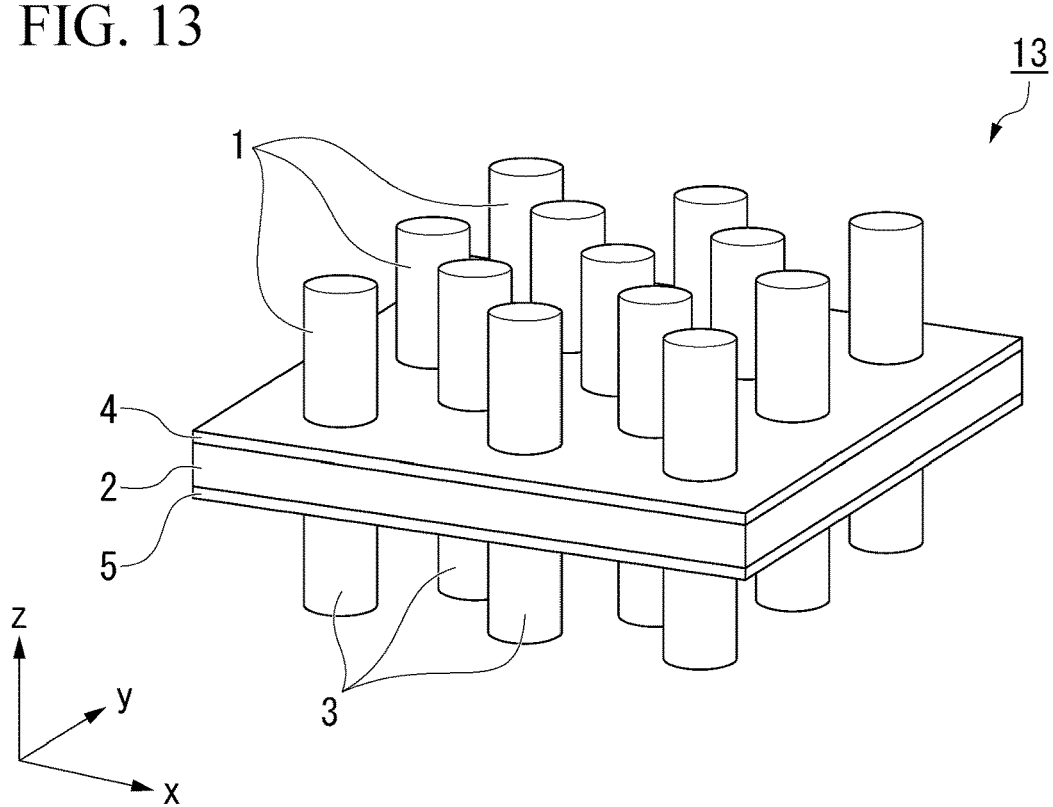
FIG. 13 is a side view of a reservoir element according to the fourth embodiment.

FIG. 13 is a cross-sectional view of a reservoir element according to the fourth embodiment. The reservoir element 13 in accordance with the fourth embodiment has the second tunnel barrier layer 5, which is different from the reservoir element 12 in accordance with the third embodiment. Other configurations are the same as those of the reservoir element 12 according to the third embodiment, and the description thereof is omitted.

The second tunnel barrier layer 5 is located between the spin conduction layer 2 and the via wiring 3. For example, the second tunnel barrier layer 5 continuously extends in the xy-plane. The second tunnel barrier layer 5 may be scattered in the xy plane only at a position between the ferromagnetic layer 1 and the spin conduction layer 2.

The second tunnel barrier layer 5 is made of a nonmagnetic insulator. The second tunnel barrier layer 5 is made of the same material as the first tunnel barrier layer 4. The thickness of the second tunnel barrier layer 5 is equal to the thickness of the first tunnel barrier layer 4.

The second tunnel barrier layer 5 has a higher spin resistance than the spin conduction layer 2. The second tunnel barrier layer 5 suppresses the spin that has reached the spin conduction layer 2 from flowing into the via wiring 3.

The reservoir element 13 according to the fourth embodiment can be applied to the neuromorphic element 100. The reservoir element 13 according to the fourth embodiment can obtain the same effects as the reservoir element 10 according to the first embodiment. The reservoir element 13 according to the fourth embodiment can efficiently generate a spin current by the spin injected into the spin conduction layer 2. Therefore, the interference of the spin current in the spin conduction layer 2 is promoted, and the reservoir element 13 can express a more complicated phenomenon.

Figure 18:
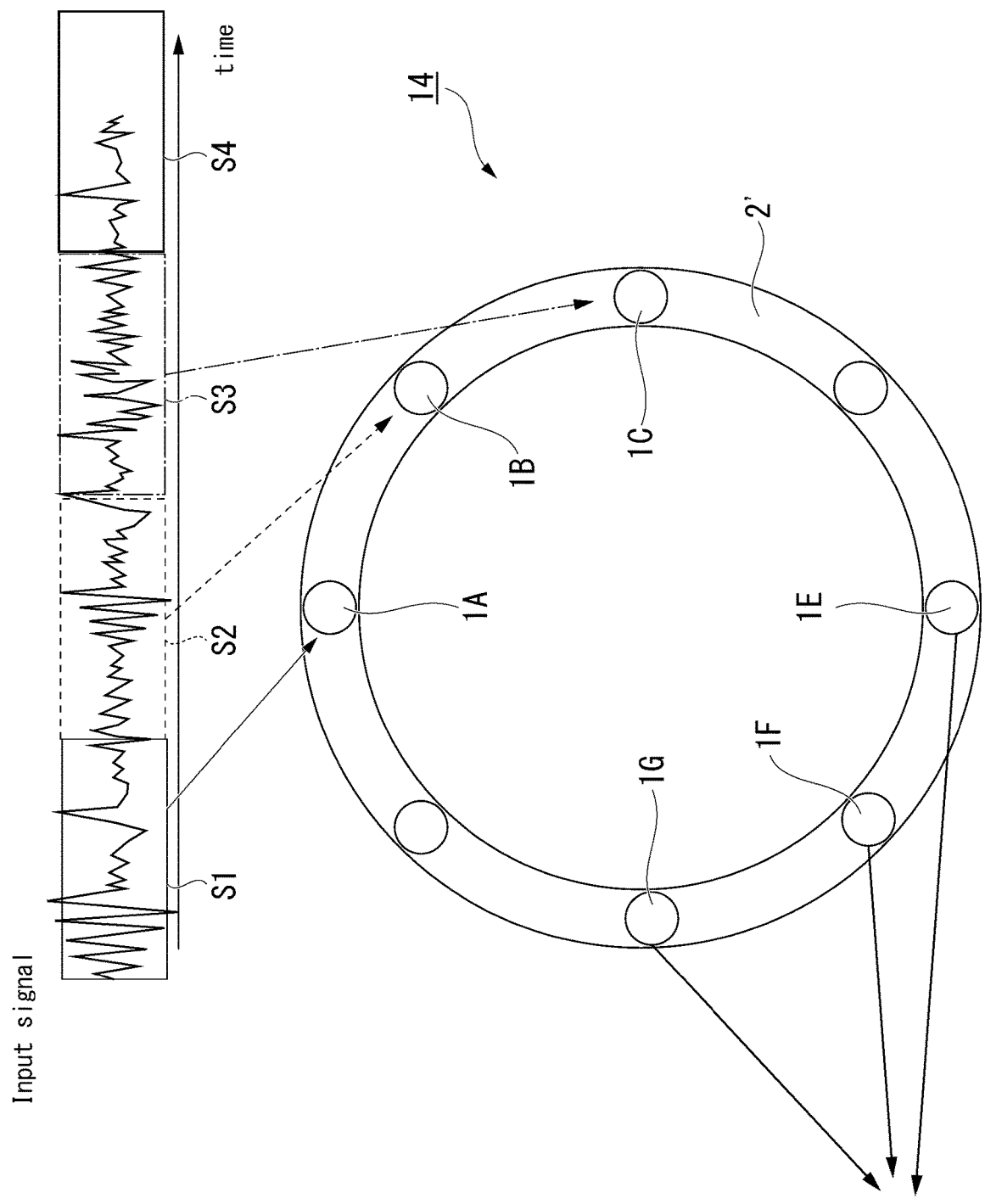
FIG. 18 is a plan view of a reservoir element according to a fifth embodiment.

FIG. 18 is a plan view of a reservoir element according to the fifth embodiment. In the reservoir element 14 according to the fifth embodiment, the first point is that the spin conduction layer 2' has an annular shape, and the plurality of ferromagnetic layers 1 are scattered along the annular spin conduction layer 2', which are different from the reservoir element 10 according to the embodiment. The other configuration is the same as the reservoir element 10 according to the first embodiment, and the description is omitted. Also, in FIG. 11, the same configuration as FIG. 1 is denoted by the same reference numerals.

The input signal is divided for each time domain, for example, and input to the reservoir element 14 as a plurality of signals S1, S2, S3, S4. For example, the signal S1 is input to the ferromagnetic layer 1A, the signal S2 is input to the ferromagnetic layer 1B, and the signal S3 is input to the ferromagnetic layer 1C. The signals S1, S2, S3, S4 . . . are converted into spin currents and input from the ferromagnetic layers 1A, 1B, 1C to the spin conduction layer 2'. The spin currents spreading from the respective ferromagnetic layers 1A, 1B, 1C propagate along the circumferential direction of the spin conduction layer 2' and interfere with each other.

The interference of the spin current in the spin conduction layer 2' is output as a potential difference from the ferromagnetic layers 1E, 1F, 1G, for example. The signal input position to the ferromagnetic layer and the signal output position from the ferromagnetic layer may be sequentially changed.

Although one preferred embodiment of the present disclosure has been described in detail, the present disclosure is not limited to this embodiment, and various modifications and changes may be made within the scope of the present disclosure as set forth in the appended claims.

For example, the characteristic configuration of the reservoir element 14 according to the fifth embodiment may be combined to the reservoir element 10 according to the first embodiment.

EXPLANATION OF REFERENCES 1, 1', 1A, 1B, 1C, 1D, 1E, 1G: Ferromagnetic layer
1A: Input terminal
1B: Output terminal
2, 2': Spin conduction layer
3, 3m: Via wiring
3C: Shared electrode layer
3G: Reference potential terminal
4: First tunnel barrier layer
5: Second tunnel barrier layer
10, 10A, 10B, 10C, 10D, 10E, 11, 12, 13, 14: Reservoir element
20: Input part
21, 22, 23, 24: Input terminal
30: Output part
31, 32: Output terminal
40: Second output part
41, 42, 43: Terminal
100: Neuromorphic element
A: Bundle
Cp: Chip
HM: Hard mask
1: Interlayer insulation film
Sb: Substrate
Sp: Synapse

What is claimed is:

1. A reservoir element comprising:
a spin conduction layer containing a non-magnetic conductor;
a plurality of ferromagnetic layers positioned in a first direction with respect to the spin conduction layer and spaced apart from each other in a plan view from the first direction; and
a plurality of via wirings electrically connected to the plurality of ferromagnetic layers via the spin conduction layer,
wherein each of the plurality of ferromagnetic layers (i) overlaps a separate one of the plurality of via wirings in the plan view from the first direction and (ii) connects with the separate one of the plurality of via wires via the spin conduction layer.

2. The reservoir element according to claim 1, further comprising a reference potential terminal electrically connected to the spin conduction layer.

3. The reservoir element according to claim 1,
wherein
the each of the plurality of via wirings contains a ferromagnetic material, and
an orientation direction of magnetization of the ferromagnetic material constituting each of the plurality of via wirings is opposite to an orientation direction of magnetization of the plurality of ferromagnetic layers.

4. The reservoir element according to claim 1, further comprising a first tunnel barrier layer between the spin conduction layer and the plurality of ferromagnetic layers.

5. The reservoir element according to claim 1, further comprising a second tunnel barrier layer between the spin conduction layer and the plurality of via wirings.

6. The reservoir element according to claim 1, wherein a distance between two adjacent ferromagnetic layers among the plurality of ferromagnetic layers is equal to or less than a spin transport length of a material constituting the spin conduction layer.

7. The reservoir element according to claim 1, wherein a distance between two adjacent ferromagnetic layers among the plurality of ferromagnetic layers is equal to or less than a spin diffusion length of a material constituting the spin conduction layer.

8. The reservoir element according to claim 1, wherein the spin conduction layer includes a metal or an alloy of an element selected from a group consisting of Cu, Ag, Al, Mg, and Zn.

9. The reservoir element according to claim 1, wherein the spin conduction layer includes a simple element or a compound of an element selected from a group consisting of Si, Ge, and C.

10. The reservoir element according to claim 1,
wherein
the plurality of ferromagnetic layers are arranged in a hexagonal lattice form in the plan view from the first direction.

11. The reservoir element according to claim 1,
wherein
the plurality of ferromagnetic layers form a plurality of bundles, the plurality of ferromagnetic layers being close-packed in each of the plurality of bundles in the plan view from the first direction, and
the ferromagnetic layers in each of the plurality of bundles are arranged in a hexagonal lattice form.

12. The reservoir element according to claim 2,
wherein
each of the plurality of via wirings contains a ferromagnetic material, and
an orientation direction of magnetization of the ferromagnetic material constituting each of the plurality of via wirings is opposite to an orientation direction of magnetization of the plurality of ferromagnetic layers.

13. The reservoir element according to claim 2, further comprising a first tunnel barrier layer between the spin conduction layer and the plurality of ferromagnetic layers.

14. The reservoir element according to claim 3, further comprising a first tunnel barrier layer between the spin conduction layer and the plurality of ferromagnetic layers.

15. The reservoir element according to claim 1,
wherein the spin conduction layer is made of a metal or a semiconductor.

16. The reservoir element according to claim 15,
wherein the spin conduction layer contains an element selected from the group consisting of Cu, Ag, Al, Mg, and Zn.

17. The reservoir element according to claim 15, wherein the spin conduction layer is made of a simple element or an alloy of an element selected from the group consisting of Si, Ge, and C.

* * * * *